United States Patent

Kadota et al.

[11] Patent Number: 5,847,486
[45] Date of Patent: Dec. 8, 1998

[54] LOVE-WAVE DEVICE INCLUDING A THIN FILM OF TA OR W

[75] Inventors: Michio Kadota; Toshimaro Yoneda; Naoki Mizoguchi, all of Nagaokakyo, Japan

[73] Assignee: Murata Manufacturing Co., Ltd., Japan

[21] Appl. No.: 746,638

[22] Filed: Nov. 13, 1996

Related U.S. Application Data

[63] Continuation of Ser. No. 458,705, Jun. 2, 1995, abandoned.

[30] Foreign Application Priority Data

Oct. 19, 1994 [JP] Japan .................................... 6-253809

[51] Int. Cl.$^6$ .................................................. H01L 41/08
[52] U.S. Cl. ....................................... 310/313 R; 310/360
[58] Field of Search ............................ 310/313 R, 313 B, 310/360

[56] References Cited

U.S. PATENT DOCUMENTS

| | | | |
|---|---|---|---|
| 4,381,469 | 4/1983 | Ogawa et al. | 310/313 R |
| 4,544,857 | 10/1985 | Shimizu et al. | 310/313 B |
| 4,672,254 | 6/1987 | Dolat et al. | 310/313 R |
| 5,153,753 | 10/1992 | Ohta et al. | 359/58 |
| 5,380,410 | 1/1995 | Sawaki et al. | 204/130 |
| 5,432,392 | 7/1995 | Kadota et al. | 310/313 A |
| 5,453,652 | 9/1995 | Eda et al. | 310/313 R |

*Primary Examiner*—Thomas M. Dougherty
*Attorney, Agent, or Firm*—Ostrolenk, Faber, Gerb & Soffen, LLP

[57] ABSTRACT

An inexpensive Love-wave device having a wide frequency difference between its resonant and antiresonant frequencies includes a Y-cut substrate made from $LiNbO_3$ for X propagation. An interdigital transducer including a thin film of Ta or W is located on the substrate for exciting a Love wave.

18 Claims, 4 Drawing Sheets

LOVE-WAVE DEVICE INCLUDING A THIN FILM OF TA OR W

This is a Continuation of application Ser. No. 08/458,705 filed on Jun. 2, 1995, now abandoned.

BACKGROUND OF THE INVENTION

1. Field of the Invention

The present invention relates to a Love-wave device having a thin film of Ta or W forming an interdigital transducer for exciting a Love wave.

2. Description of the Related Art

A prior art Love-wave device is shown in FIG. 8, where a thin film 11a of Au is formed on a Y-cut substrate 10 for X propagation. The substrate 10 is made from $LiNbO_3$. Since this Au thin film 11a is only able to weakly adhere to the $LiNbO_3$ substrate 10, a thin film 11b of Cr is first formed on the substrate 10. Then, the Au thin film 11a is formed on the Cr thin film 11b. Thereafter, an interdigital transducer 11 is formed by photolithographical techniques. Heretofore, Love-wave devices making use of Rayleigh waves have received wide acceptance.

Japanese Patent Application Ser. No. 004815/1993 discloses a structure obtained by forming an interdigital transducer 21 comprising a thin film of Al on a Y-cut X-propagation substrate 20 of $LiNbO_3$ and then forming a film 22 of ZnO, as shown in FIG. 9. This structure also excites a Love wave. More specifically, this Love wave can be excited by forming on the $LiNbO_3$ substrate a metal thin film having an SAW (surface acoustic wave) velocity smaller than that of the substrate.

Also, in a device having periodic metallic strips rather than a uniform thin film, a Love wave is excited as described in the following articles: Shimizu and Mizunuma, "Love Wave Type Elastic Surface Wave Substrate of High Coupling (K2 is approximately 0.3)", Report on Technical Research by Electronic Communications Society of Japan, US82-35 and Suzuki and Shimizu, "Propagation Characteristics of Love Wave Type Elastic Acoustic Waves in Au-Strip-Array/YX-$LiNbO_3$ Structure and its Application to IDT Resonator", Report on Technical Research by Electronic Communications Society of Japan, US86-37.

The prior art Love-wave devices using Au thin-film electrodes use a base made from Cr or other material on the Au thin-film electrodes. Therefore, the process for forming such a prior art Love-wave device is complex. Furthermore, the use of Au makes the devices expensive.

On the other hand, Love-wave devices using Rayleigh waves have small electromechanical coupling factors k and thus, it is difficult to widen the frequency difference between their resonant and antiresonant frequencies.

In the articles discussed above, analyses of Love waves are made where thin films of Ag, BGO ($Bi_{12}GeO_{20}$), $SiO_2$, and Au are used. However, the prior art does not disclose a Love-wave device having interdigital transducers formed of a thin film formed of Ta or W.

SUMMARY OF THE INVENTION

Accordingly, it is an object of the present invention to provide a Love-wave device comprising an interdigital transducer (IDT) made from a material (e.g., Ta or W) different from the above-described conventional Love wave excitation IDT materials, whereby the device is capable of exciting a Love wave.

One embodiment of the invention provides a Love-wave device comprising a Y-cut substrate for X-propagation and an interdigital transducer for exciting a Love wave. The substrate is made from $LiNbO_3$. The interdigital transducer is a thin film of Ta located on the substrate.

Another embodiment of the invention provides a Love-wave device comprising a Y-cut substrate for X-propagation and an interdigital transducer for exciting a Love wave. The substrate is made from $LiNbO_3$. The interdigital transducer is a thin film of W located on the substrate.

In the present invention, an interdigital transducer is made of a thin film of Ta or W on a Y-cut $LiNbO_3$ substrate for X propagation. Large electromechanical coupling factors k are obtained in a wide range of film thicknesses of Ta or W, and Love waves can be excited. Also, the Love-wave devices according to the embodiments of the present invention are easier to manufacture and less expensive than prior art devices because no base rates such as a Cr is required and the use of W or Ta costs less than Au used in the prior art devices.

Other objects and features of the invention will appear in the course of the description thereof, which follows.

DETAILED DESCRIPTION OF THE PREFERRED EMBODIMENTS

A first embodiment of the invention demonstrates that a thin film of Ta can excite a Love wave. An interdigital transducer is made of a thin film of Ta. A Love-wave device is fabricated, using the interdigital transducer formed of the thin film of Ta.

Figure 1:
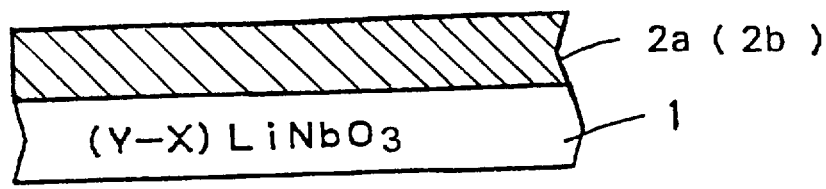
FIG. 1 is a fragmentary cross section of a Love-wave device used for analysis of Love waves according to the invention.

FIG. 1 shows a structure for analyzing Love waves. This structure comprises a Y-cut substrate 1 made from $LiNbO_3$ for X propagation and a uniform thin film 2a of Ta on the substrate 1. The thickness $H_{Ta}$ of the Ta thin film 2a is normalized with the wavelength $\lambda$ of surface wave, thus resulting in normalized film thickness $H_{Ta}/\lambda$.

Figure 2:
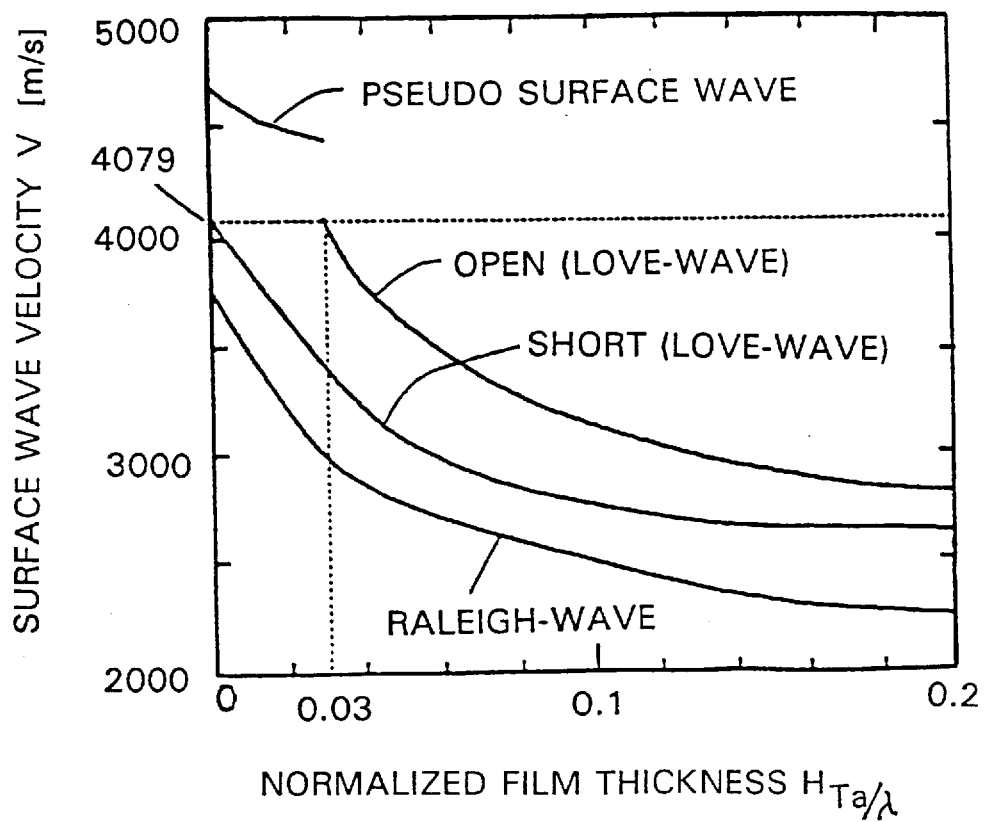
FIG. 2 is a graph showing the relation of the SAW velocity V to normalized film thickness $H_{Ta}/\lambda$ of a first embodiment of the invention.

In FIG. 2, the normalized film thickness $H_{Ta}/\lambda$ is plotted on the horizontal axis, while the SAW velocity V is plotted on the vertical axis. In FIG. 2, the broken line drawn at the position of a SAW velocity of 4079 m/s indicates a slow transverse wave velocity propagating in the X-direction of the LiNbO$_3$ substrate. In the range in which the SAW velocity is greater than this transverse velocity, the wave is a pseudo SAW. In the range in which the SAW velocity is smaller than this transverse velocity, the wave is a Love wave.

Since the present invention is not directly related to extinction and advent of the pseudo SAW and the Love wave, these waves will not be described further. With respect to the advent of a Love wave in an open state, it can be seen that excitation of a Love wave is started at $H_{Ta}/\lambda$ (normalized film thickness)=0.03. In the structure shown in FIG. 1, as the thickness of the Ta thin film 2a is increased, the SAW velocity V decreases. On the other hand, a Love wave in a shorted state is started to be excited at $H_{Ta}/\lambda$ (normalized film thickness)=0.

FIG. 2 also shows the SAW velocity of a Rayleigh wave. The phase velocity of the Rayleigh wave in an open state is substantially the same as the phase velocity of the Rayleigh wave in a shorted state. The electromechanical coupling factor k which is indicated by the difference between these open and shorted-state Rayleigh waves is almost zero. This means that interdigital electrodes excite almost no Rayleigh waves. The SAW velocity of Love waves is very different from the SAW velocity of Rayleigh waves and, therefore, when Love waves are used, Rayleigh waves are less likely to cause spurious signals.

The open and shorted states described above are now described in further detail. The fundamental formulas for piezoelectricity are given by $$T_i = c_{ij}S_j - e_{mi}E_m$$

$$D_n = e_{nh}S_h + \epsilon_{nm}E_m$$

where $T_i$ is a stress, $c_{ij}$ is an elastic constant, $S_j$ is a strain, $e_{mi}$ is a piezoelectric constant, $E_m$ is an electric field, $D_n$ is an electric flux, $e_{nh}$ is a piezoelectric constant, $S_h$ is a strain, and $\epsilon_{nm}$ is a dielectric constant. Therefore, in an open state, $E_m \neq 0$ in the fundamental formulas described above. In a shorted state, $E_m = 0$ in the fundamental formulas described above.

Figure 3:
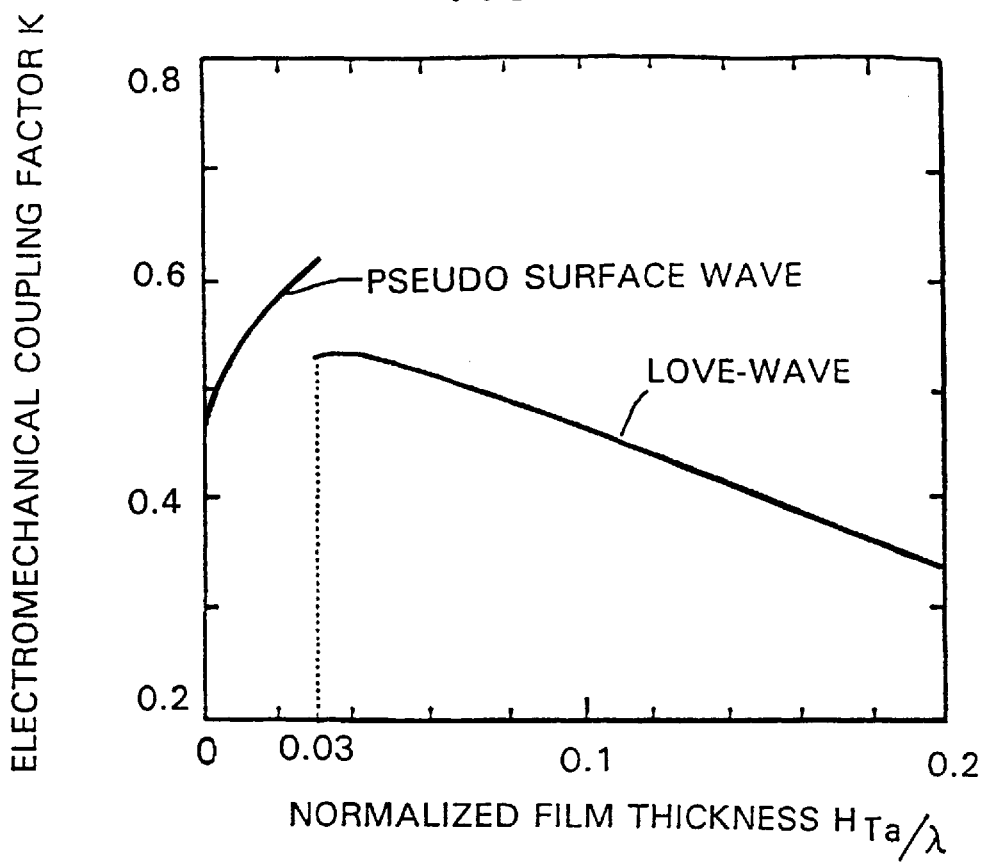
FIG. 3 is a graph showing the relation of the electromechanical coupling factor k to normalized film thickness $H_{Ta}/\lambda$ of the first embodiment of the invention.

In FIG. 3, the normalized film thickness $H_{Ta}/\lambda$ of the structure shown in FIG. 1 is plotted on the horizontal axis, and the electromechanical coupling factor k is plotted on the vertical axis. As can be seen from the graph of FIG. 3, the electromechanical coupling factor k assumes the greatest value of 0.54 when the normalized film thickness $H_{ta}/\lambda$ is 0.04. In the wide range from 0.03 to 0.15 of $H_{Ta}/\lambda$, the relation k>0.4 (40%) is true. In a wide range of the film thickness of Ta thin film 2a, if a VCO (voltage-controlled oscillator) is constructed, the variable frequency range can be made broader.

Figure 4:
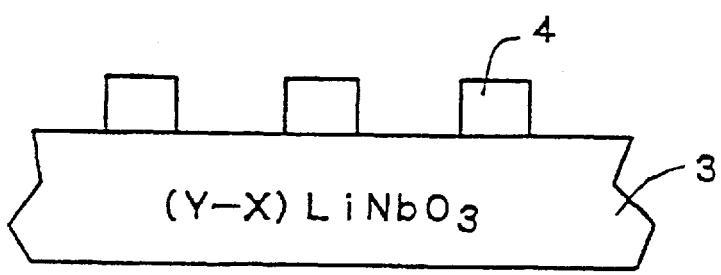
FIG. 4 is a schematic cross section of the first embodiment of the invention.
Figure 5:
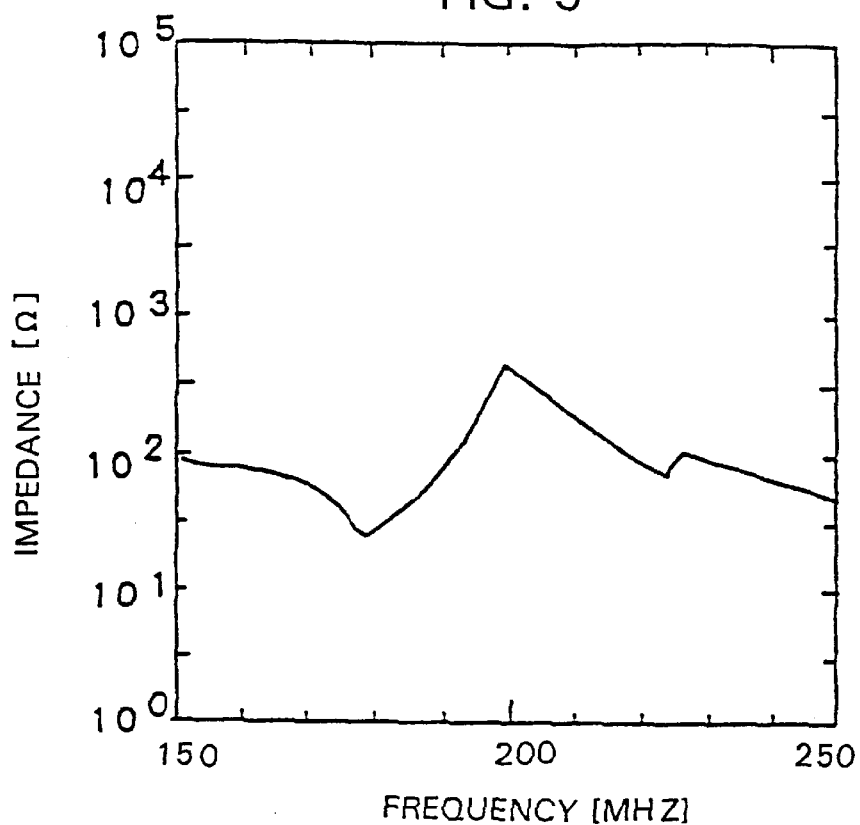
FIG. 5 is a graph showing the impedance characteristics of the first embodiment of the invention.

As shown in FIG. 4, an interdigital transducer 4 comprising a thin film of Ta is formed on a Y-cut substrate 3 for X propagation. In a preferred embodiment, the substrate 3 is made from LiNbO$_3$ and has a length of 2.0 mm, a width of 1.8 mm, and a thickness of 0.5 mm. The number N of pairs of the interdigital electrodes of the transducer 4 is 25. The pitch between the interdigital electrodes is 9.9 $\mu$m. The adjacent interdigital electrodes overlap by about 495 $\mu$m with each other. The thickness of the interdigital electrodes 4 is 0.7 $\mu$m. The impedance characteristics of the Love-wave device having these dimensions are shown in FIG. 5.

Figure 6:
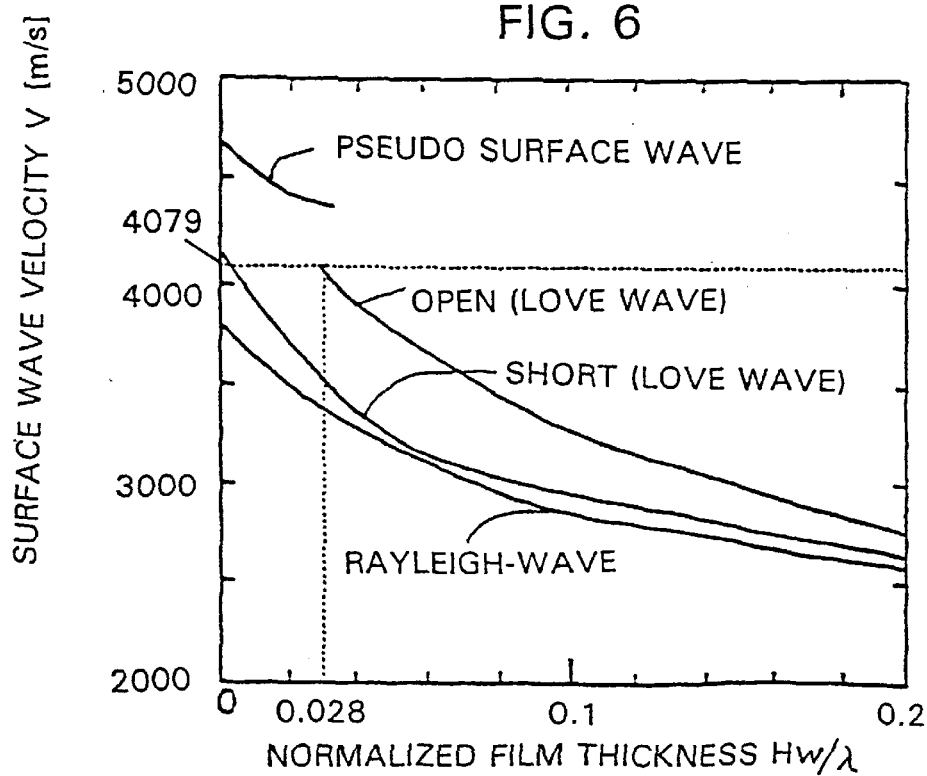
FIG. 6 is a graph showing the relation of the SAW velocity V to normalized film thickness $H_W/\lambda$ of a second embodiment of the invention.

A second preferred embodiment of the invention demonstrates that a thin film of W can excite a Love wave. This thin film of W forms an interdigital transducer, which in turns forms a Love-wave device. Instead of the thin film 2a of Ta used in the first example shown in FIG. 1, a thin film 2b of W is used. The thickness $H_W$ of this W thin film 2b is normalized with the wavelength $\lambda$ of a surface wave, thus obtaining normalized film thickness $H_W/\lambda$. In FIG. 6, the normalized film thickness $H_W/\lambda$ is plotted on the horizontal axis, while the SAW velocity V is plotted on the vertical axis. The graph of FIG. 6 corresponds to the graph of FIG. 2. Since the principle used in the description of FIG. 2 can be similarly applied to the graph of FIG. 6, the graph of FIG. 6 is not described in detail below. It can be seen from the graph of FIG. 6 that a Love wave can be excited in the range in which the normalized film thickness $H_W/\lambda$ is greater than 0.028.

Figure 7:
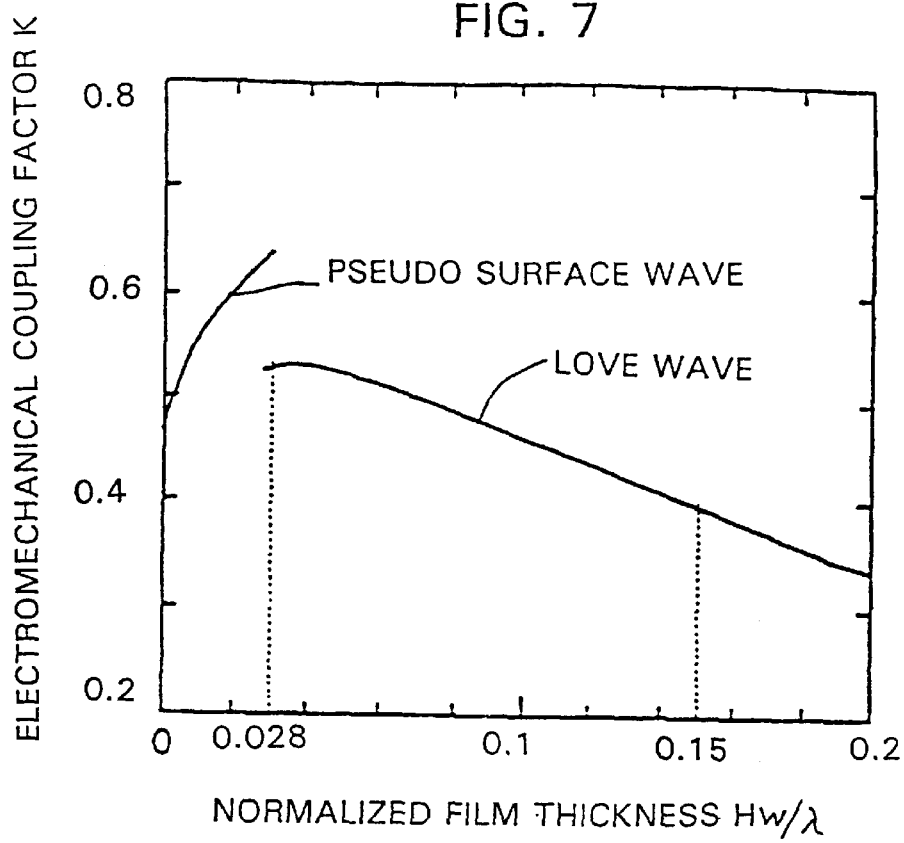
FIG. 7 is a graph showing the relation of the electromechanical coupling factor k to normalized film thickness $H_W/\lambda$ of the second embodiment of the invention.
Figure 8:
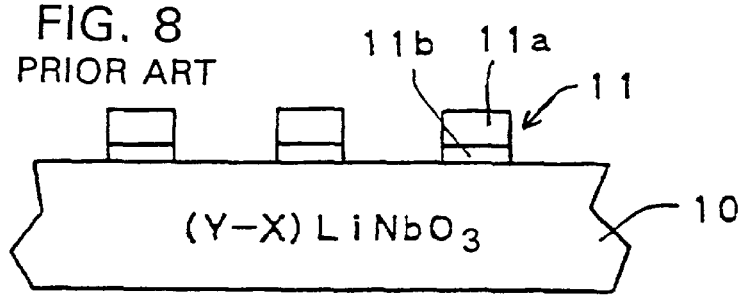
FIG. 8 is a schematic cross section of a known Love-wave device.
Figure 9:
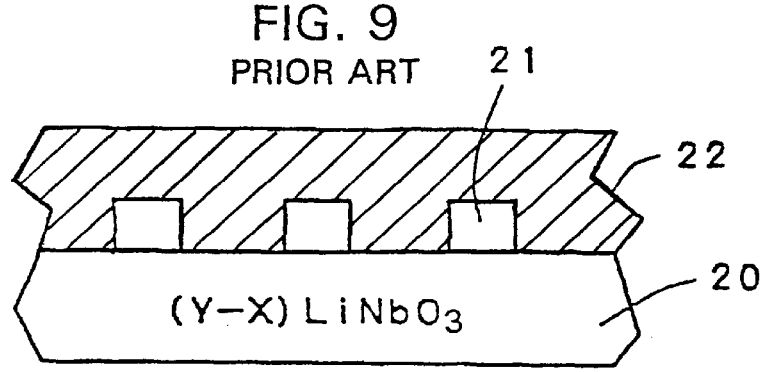
FIG. 9 is a schematic cross section of another known Love-wave device.

In FIG. 7, normalized film thickness $H_W/\lambda$ is plotted on the horizontal axis, whereas electromechanical coupling factor k is plotted on the vertical axis. It can be seen from the graph of FIG. 7 that the coupling factor k assumes the greatest value of 0.52 if normalized film thickness $H_W/\lambda$ is 0.04. In the wide range from 0.028 to 0.15 of $H_W/\lambda$, the relation k>0.4 (40%) holds. In a wide range of the film thickness of the W thin film, the frequency difference between the resonant and antiresonant frequencies can be made broader.

In the present invention, an interdigital transducer is formed of a thin film of Ta or W on a Y-cut LiNbO$_3$ substrate for X propagation. Consequently, with a relatively simple structure, large electromechanical coupling factors k can be obtained in a wide range of film thicknesses of Ta or W. Furthermore, cost reduction can be accomplished, because Ta and W are cheaper materials than Au.

What is claimed is:

1. A Love-wave device comprising:
   a Y-cut LiNbO$_3$ substrate for X-propagation; and
   an interdigital transducer for exciting a Love wave,
   said transducer consisting essentially of a thin film of W located on said Y-cut substrate.

2. A Love-wave device according to claim 1, wherein said transducer is a single layer of W located on said Y-cut LiNbO$_3$ substrate.

3. A Love-wave device comprising:
   a Y-cut LiNbo$_3$ substrate for X-propagation; and
   an interdigital transducer for exciting a Love wave,
   wherein said transducer comprises a thin film of Ta located on said Y-cut substrate.

4. A Love-wave device comprising:
   a Y-cut LiNbO$_3$ substrate for X propagation; and
   an interdigital transducer for exciting a Love wave;
   said transducer comprises a thin film of Ta located on said Y-cut substrate; wherein
   said thin film of Ta has a normalized film thickness $H_{Ta}/\lambda$ of about 0.03 to 0.15, where $H_{Ta}$ represent a film thickness of said thin film of Ta and $\lambda$ represents a wavelength of said Love wave.

5. A Love-wave device according to claim 4, wherein said normalized film thickness is about 0.04 and an electromechanical coupling factor k of said transducer and said Y-cut LiNbO$_3$ substrate is about 0.54.

6. A Love-wave device according to claim 4, wherein an electromechanical coupling factor k of said transducer and said Y-cut LiNbO$_3$ substrate is greater than about 0.4.

7. A Love-wave device comprising:
   a Y-cut LiNbO$_3$ substrate for X propagation; and
   an interdigital transducer for exciting a Love wave;
   said transducer consisting essentially of a thin film of W located on said Y-cut substrate; wherein
   said thin film of W has a normalized film thickness $H_W/\lambda$ of about 0.028 to 0.15, where $H_W$ represent a film thickness of said thin film of W and λ represents a wavelength of said Love wave.

8. A Love-wave device according to claim 7, wherein said normalized film thickness is about 0.04 and an electromechanical coupling factor k of said transducer and said Y-cut LiNbO$_3$ substrate is about 0.52.

9. A Love-wave device according to claim 7, wherein an electromechanical coupling factor k of said transducer and said Y-cut LiNbO$_3$ substrate is greater than about 0.4.

10. A Love-wave device according to claim 7, wherein said transducer is a single layer of W located on said Y-cut LiNbO$_3$ substrate.

11. A Love-wave device comprising:

a Y-cut substrate for X-propagation; and an interdigital transducer for exciting a Love wave, wherein said transducer comprises a thin film of Ta located on said Y-cut substrate, a SAW velocity of said Y-cut substrate being higher than that of Ta.

12. A Love-wave device according to claim 11, wherein said thin film of Ta has a normalized film thickness $H_{Ta}/\lambda$ of about 0.03 to 0.15, where $H_{Ta}$ represents a film thickness of said thin film of Ta and λ represents a wavelength of said Love wave.

13. A Love-wave device according to claim 12, wherein said normalized film thickness is about 0.04 and an electromechanical coupling factor k of said transducer and said Y-cut substrate is about 0.54.

14. A Love-wave device according to claim 11, wherein an electromechanical coupling factor k of said transducer and said Y-cut substrate is greater than about 0.4.

15. A Love-wave device comprising:

a Y-cut substrate for X-propagation; and an interdigital transducer for exciting a Love wave, said transducer consisting essentially of a thin film of W located on said Y-cut substrate, a SAW velocity of said Y-cut substrate being higher than that of W.

16. A Love-wave device according to claim 15, wherein said thin film of W has a normalized film thickness $H_W/\lambda$ of about 0.028 to 0.15, where $H_W$ represents a film thickness of said thin film of W and λ represents a wavelength of said Love wave.

17. A Love-wave device according to claim 16, wherein said normalized film thickness is about 0.04 and an electromechanical coupling factor k of said transducer and said Y-cut substrate is about 0.52.

18. A Love-wave device according to claim 15, wherein an electromechanical coupling factor k of said transducer and said Y-cut substrate is greater than about 0.4.

* * * * *